United States Patent [19]

Nakajima

[11] Patent Number: 5,021,224
[45] Date of Patent: Jun. 4, 1991

[54] APPARATUS FOR GROWING MULTICOMPONENTS COMPOUND SEMICONDUCTOR CRYSTALS

[75] Inventor: Kazuo Nakajima, Kawasaki, Japan

[73] Assignee: Fujitsu Limited, Kawasaki, Japan

[21] Appl. No.: 864,982

[22] Filed: May 20, 1986

Related U.S. Application Data

[62] Division of Ser. No. 652,239, Sep. 19, 1984, Pat. No. 4,620,897.

[30] Foreign Application Priority Data

Sep. 19, 1983 [JP] Japan ................. 58-171174
Jan. 26, 1984 [JP] Japan ................. 59-11090

[51] Int. Cl.$^5$ ................................ C30B 35/00
[52] U.S. Cl. ......................... 422/248; 422/249; 422/245
[58] Field of Search ......... 156/602, 621, 624, 617 SP, 156/617.1, 619.1; 422/245, 248, 249, 253; 204/299 EC, 300 EC; 118/620, 625, 626, 628

[56] References Cited

U.S. PATENT DOCUMENTS

| | | | |
|---|---|---|---|
| 3,058,915 | 10/1962 | Bennett | 156/602 |
| 3,086,857 | 4/1963 | Pfann | 156/602 |
| 3,600,294 | 8/1971 | Rubin et al. | 156/602 |
| 3,948,692 | 4/1976 | Golubev et al. | 156/602 |
| 4,133,705 | 1/1979 | André | 156/602 |
| 4,186,045 | 1/1980 | Gatos et al. | 156/602 |

OTHER PUBLICATIONS

Kumagawa et al., "Current-Controlled Growth and Dopant Modulation in Liquid Phase Expitaxy," J. Electrochem. Soc. 120(4) 1973, pp. 583-584.

Primary Examiner—H. M. S. Sneed
Assistant Examiner—R. Bruce Breneman
Attorney, Agent, or Firm—Armstrong, Nikaido, Marmelstein, Kubovcik & Murray

[57] ABSTRACT

A method and apparatus for growing crystals of a more than three multicomponents compound semiconductor from its growth solution in which a source material containing at least one solute element is immersed and dissolved in the growth solution by conducting DC electric current from a current supplying electrode immersed in the growth solution through the growth solution to the source material, and thus a desired composition of the growth solution can be constantly maintained. As a result, the composition of the grown crystals of the multicomponents compound semiconductor can be also controlled to a desired proportion.

5 Claims, 20 Drawing Sheets

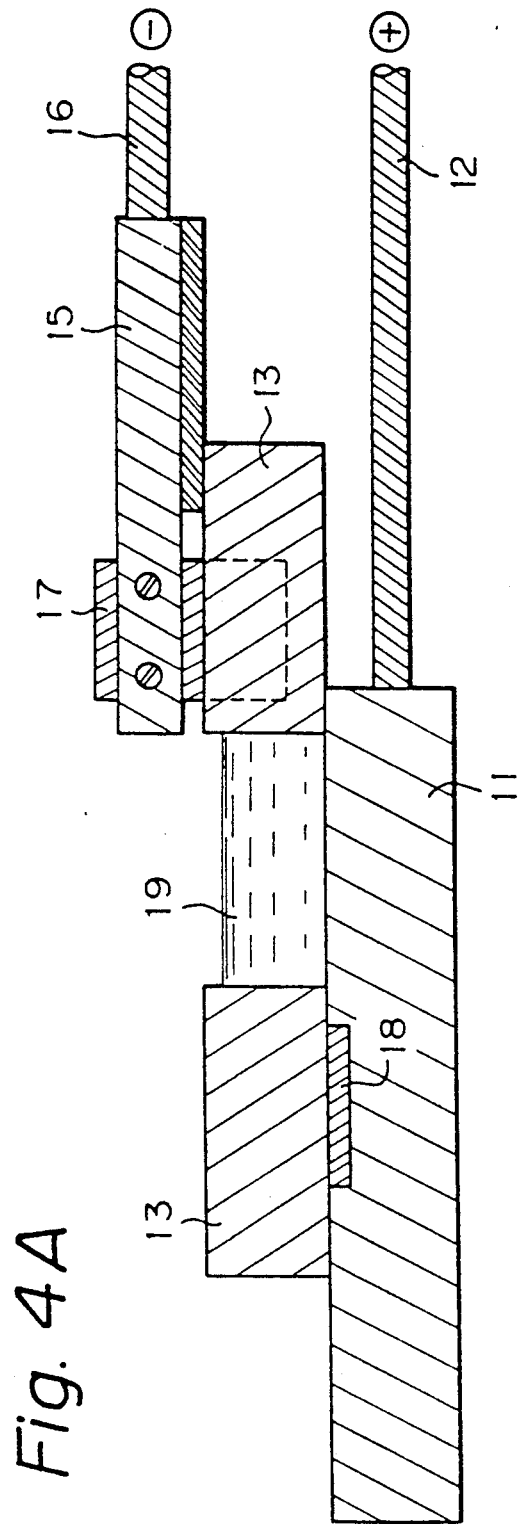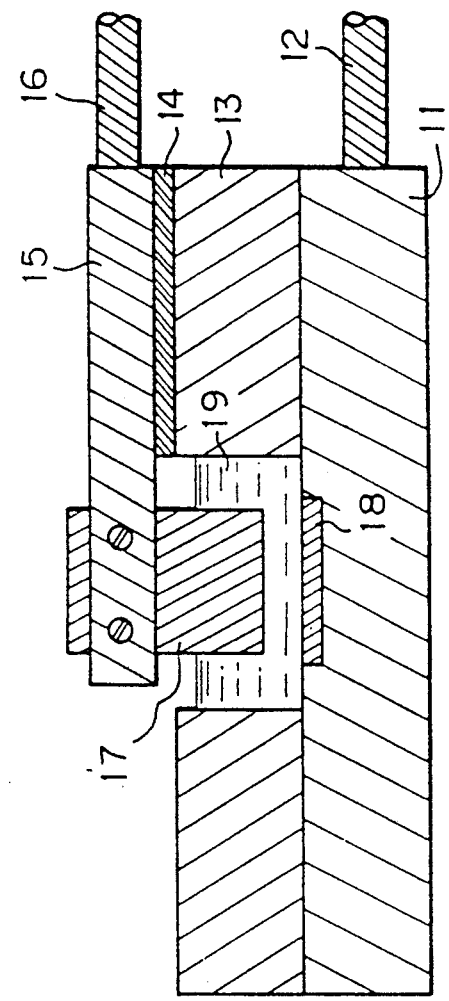
Fig. 4A
Fig. 4B

APPARATUS FOR GROWING MULTICOMPONENTS COMPOUND SEMICONDUCTOR CRYSTALS

This is a division of application Ser. No. 652,239 filed Sep. 19, 1984, now U.S. Pat. No. 4,620,897.

BACKGROUND OF THE INVENTION

1. Field of the Invention

This invention relates to a crystal growth method and, more particularly, to a method for growing crystals of the multicomponent compound semiconductor, for example, ternary and quaternary semiconductor compounds such as $In_{1-x}Ga_xAs$, $InAs_xP_{1-x}Ga_xSb$, $GaAs_xP_{1-x}$, and $In_{1-x}Ga_xAs_{1-y}P_y$ compounds, in a saturated growth solution t This invention also relates to an apparatus for carrying out the above crystal growth method.

The new growth method and apparatus of this invention are effective for controlling the composition of the growth solution and, therefore, the composition of the grown crystals to a desired proportion.

2. Description of the Prior Art

Heretofore, various two component compound semiconductors (also known as binary semiconductors) have been widely used in the production of semiconductor devices. Recently, compound semiconductors containing three or more components or elements, generally referred to as multicomponent compound semiconductors, are used for the same purpose, since they have excellent electrical properties similar to or higher then those of the binary semiconductors. Typical of these compound semiconductors are ternary and quaternary semiconductors of Group III-V and Group II-VI elements of the Periodic Table, for example, $In_{1-x}Fa_xAs$, $InAs_xP_{1-x}$, $In_{1-x}Ga_xSb$, $In_{1-x}Al_xAs$, $GaAs_xP_{1-x}$, $Ga_{1-x}In_xP$, $Ga_{1-x}P$, $In_{1-x}Ga_xAs_{1-y}P_y$, and the like.

In the production of these multicomponent compound semiconductors in the form of crystals, there are several problems to be solved First, only limited types of the compound semiconductors can be prepared by the conventional method, since the number of binary or ternary compounds usable as the substrate in the crystal growth applications are limited, and the resulting compound semiconductors must be lattice-matched to the substrate. Further, although the $In_{1-x}Ga_xAs$, $InAs_xP_{1-x}$, $In_{1-x}Ga_xSb$, $GaAs_xP_{1-x}$, $In_{1-x}Ga_xAs_{1-y}P_y$ and similar bulk single crystals can be conventionally produced by well-known methods such as the encapsulated Czochralski and gradient freeze methods, they contain an unfixed proportion or ratio of the elements constituting them: caused by compositional variations of the growth solution during the crystal growth step due to depletion of the solute elements in the solution essential to complete the compound semiconductor crystals The saturated growth solution for use in the formation of the multicomponent compound semiconductor crystals is in the form of a solution or melt (hereinafter referred to as solution), and essentially consists of or contains two or more solute elements In addition, it is difficult to obtain a thick homogeneous epitaxial layer of the compound semiconductors by means of a liquid phase epitaxy (LPE) process, because, as described above, solute elements in the growth solution having a finite or limited volume are depleted during the growth of the crystals. The above problems will be now described with reference to the figures. FIG. 1 illustrates an X-Y compositional plane of InGaAsP quaternary compounds and FIG. 2 shows a phase diagram of quasi-binary system compounds. As illustrated in the diagram of FIG. 1, the InGaAsP quaternary compounds ideally can possess any composition of four essential elements In, Ga, As, and P. Further, the InGaAsP compounds have three important areas, one of which is a high speed area A. The compounds belonging to this area will enable the production of semiconductor devices having a high speed response. The second area is a carrier confinement area B, in which area the compounds have an increased capability for uptaking carriers The third area is a shorter wavelength area C, in which area the compounds are effective for the production of semiconductor devices capable of emitting visible radiation.

However, since the materials usable as the substrate in the production of the InGaAsP quaternary compounds are limited to only two types, namely, InP and GaAs (other binary compounds are not available), the scope of the resulting InGaAsP compounds is substantially outside the areas A, B, and C described above. In practice, possible InGaAsP compounds are indicated by two characteristic lines, a and b, since these can be lattice-matched to the substrates InP and GaAs, respectively. It is, therefore, desirable to provide bulk single crystals of the ternary compounds such as InGaAs, InAsP, InGaP, GaAsP, and the like: Since, if these crystals are available and usable as the substrate, an epitaxial layer of InGaAsP compounds with various lattice constants which covers the areas A, B, and C can be freely grown on the substrate. Further, if such InGaAsP compounds are available, they will remarkably increase the degree of flexibility and freedom in the design, fabrication, specification, and the like of the finally produced InGaAsP-based semiconductor device. Of course, these results are commonly applicable to all multicomponents compound semiconductors of Group III-V and Group II-IV elements in addition to the abovediscussed InGaAsP compounds.

The reason why crystals, namely bulk crystals or epitaxial crystals of the multicomponent compound semiconductors have not yet been provided, in spite of the widespread demand by users', is apparent from FIG. 2 showing a phase diagram of quasi-binary compounds AC and BC. In FIG. 2, it is assumed that AC and BC mean GaAs and InAs, respectively and therefore AC has a higher melting point than that of BC. It is apparent from a liquidus line l and a solidus line s that the composition $X^l$ of the growth solution is different from the composition $X^s$ of the crystals at the same growing temperature $T_G$ and, accordingly, if the growth solution used has a finite volume, the element A or Ga in the growth solution is gradually consumed and, therefore, the composition of the growth solution varies, as shown by arrow x in the line l. Further, accompanying the compositional variation of the growth solution, the composition of the growing crystals also varies, as indicated by arrow y in the line s. These results demonstrate that the use of the growth solution having a finite volume does not ensure the growth of crystals having a uniform composition, and necessarily results in bulk crystals or epitaxial crystals with compositional variation. Thus, it is conceived that homogeneous crystals of the multicomponents compound semiconductors will be produced when the high-melting compound AC or GaAs is supplied to the saturated growth solution under controlled conditions during the crystal growth step.

Recently, J. J. Daniele and A. J. Hebling, have reported in J. Appl. Phys., 52 (1981) 4325 that very thick epitaxial layers (up to 600 μm) of $Al_{1-x}Ga_xAs$ having a uniform composition could be grown by the Peltier-induced liquid phase epitaxy (LPE) process. In their work, an $Al_{1-x}Ga_xAs$ shell floating on the top of the growth solution was used as a source material, namely, material capable of supplying solute elements. However, the Daniele and Hebling method is not intended to control the supply of the solute elements into the growth solution, and no controllable methods of supplying solute elements into the growth solution have been developed as yet.

SUMMARY OF THE INVENTION

The present inventor have developed a new method to control the supply of solute elements into the saturated growth solution during the growth of the crystals of the multicomponent compound semiconductors. DC electric current is conducted from the growth solution to a source material containing solute elements, which material is immersed in the growth solution. The solute elements, as previously described, mean elements essential to complete the compound semiconductors and also contained in the growth solution. As a result of application of the DC electric current, the source material is dissolved into the growth solution due to Peltier heating at the interface between the source material and the growth solution and Joule heating within the source material. That is, the source material can play a dual role, as the source material and as the self-heater, in this new method. Therefore, it is expected that the composition of the growth solution can be controlled or maintained at a desired or fixed ratio by increasing or decreasing the electric current conducted through the growth solution and the source material. This method is hereinafter referred to as a source current-controlled method or, briefly, SCC method.

According to this invention, there is provided a method for growing crystals of a three or more multi-component compound semiconductor from its growth solution on a seed crystal or substrate, which comprises immersing one or more source materials containing at least one element essential to complete the compound semiconductor in the growth solution, immersing a current supplying electrode in the growth solution, and dissolving the source materials in the growth solution by conducting controlled DC electric current from the current supplying electrode through the growth solution to the source materials, thereby constantly maintaining a desired composition of the growth solution during the crystal growth step.

In the crystal growth method of this invention, it should be noted that the electric current is not supplied through the seed crystal or substrate to the growth solution, but supplied through the current supplying electrode separately immersed in the growth solution.

The method of this invention can be effectively used in the production of both bulk crystals and liquid phase epitaxial crystals of compound semiconductors having three or more multiple components According to this invention, there is also provided an apparatus for growing crystals of a three or more multi-component compound semiconductor from its growth solution on a seed crystal or substrate, which comprises a container for the growth solution, at least one source material which contains at least one element essential to complete the compound semiconductor, and one end of the material being immersed in said growth solution and another end of the material being connected with a negative electrode, and a positive electrode immersed in the growth solution, the positive electrode being separately disposed from the seed crystal or substrate In the practice of this invention, the container used for receiving the growth solution and for growing the crystals may have any desired configuration, such as crucible, boat, and the like, conventionally used in the art for the purpose of crystal growth.

The source material containing solute elements can be used in any suitable configuration matching to the growth method of the crystals For example, it may be used in the form of a plate, rod, or the like. Further, it may constitute or be combined with a wall of the container, if appropriate. In addition, if desired, the positive electrode or an electrically conductive material connected therewith may constitute or be combined with a wall of the container.

The growth solution used in the formation of the multicomponent compound semiconductor crystals is a finite solution or solution having a limited volume. However, this solution can be practically considered to be an infinite solution, since its volume and composition can be freely controlled as a result of the dissolution of the source material In addition, the dissolution of the source material can be freely controlled by increasing or decreasing the electric current flowing from the growth solution to the source material Since the growth solution can be continuously used without variation of the composition, insofar as it is not depleted during the growth step, bulk crystals as well as epitaxial crystals of the multicomponent compound semiconductors having a desired composition can be easily produced.

Further, it is noted that the SCC method of this invention described herein should be distinguished from the prior art liquid phase electro-epitaxial growth method. The liquid phase electro-epitaxial growth method is intended to increase the speed of the crystal growth and comprises conducting an electric current to the substrate to decrease the temperature of the interface between the substrate and the growth solution and to cause movement of the atoms in the growth solution due to electromigration. This prior art method is frequently used in the art for determining the resistivities of the substrate and, accordingly, precisely monitoring the thickness of the resulting epitaxial layer.

BRIEF DESCRIPTION OF THE DRAWINGS

FIGS. 4A and 4B are cross-sectional views of the growth apparatus according to another preferred embodiment of this invention, in which FIGS. 4A and 4B show settings of the boat before and during the growth of the crystals, respectively;

DESCRIPTION OF THE PREFERRED EMBODIMENTS

Figure 1:
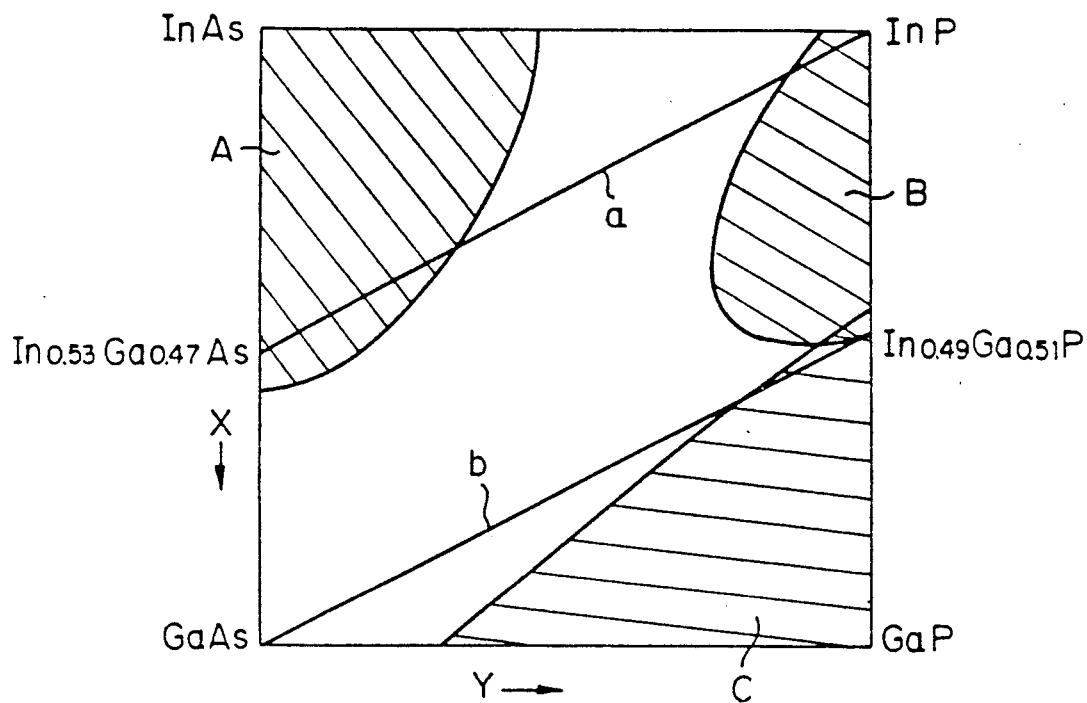
FIG. 1 shows an X-Y compositional plane of InGaAsP quaternary compounds.
Figure 2:
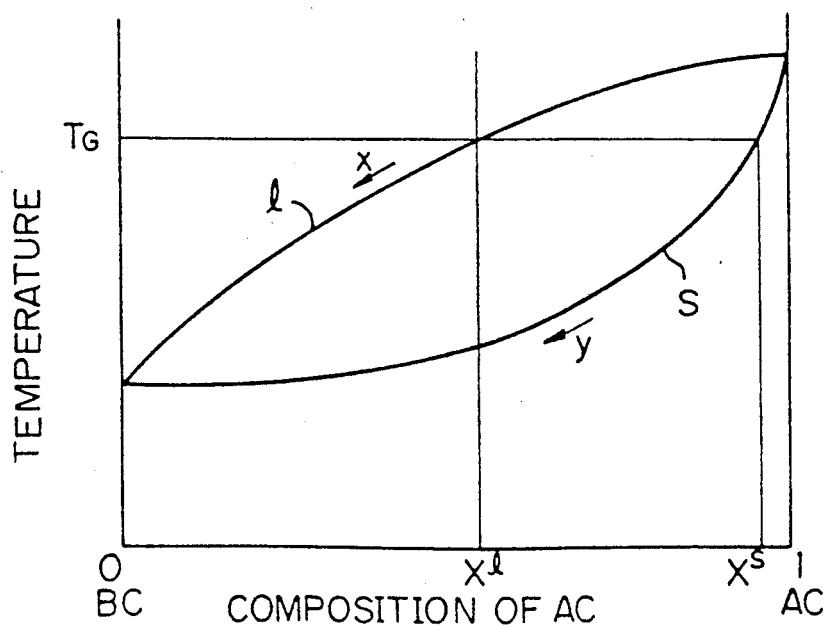
FIG. 2 shows a phase diagram of quasi-binary compounds AC and BC.
Figure 3:
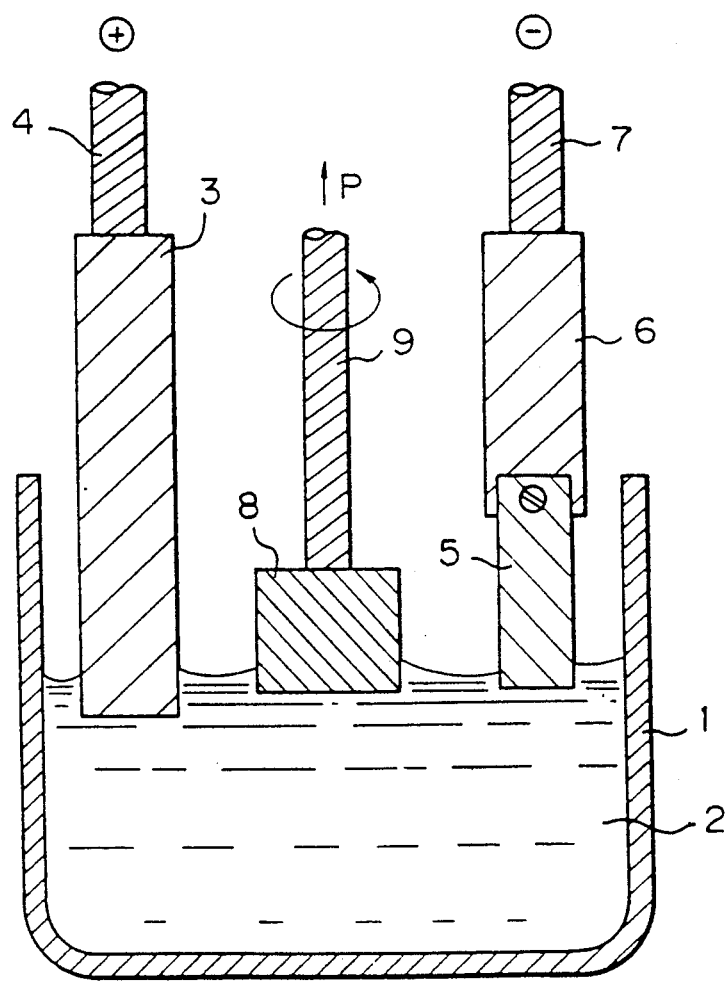
FIG. 3 is a cross-sectional view of the growth apparatus according to a preferred embodiment of this invention.

A preferred embodiment of this invention can be found in FIG. 3, which shows a system of pulling the crystals As shown in the drawing, the source material 5 is connected with a negative electrode 7 of stainless steel through a carbon electrode 6, and a top portion of the source material 5 is immersed in the growth solution 2 in a crucible 1. Further, a carbon electrode 3 connected with positive electrode 4 of stainless steel and a seed crystal 8 supported by a rotatable seed holder 9 are also immersed in the growth solution 2. The seed crystal 8 is pulled in the direction of arrow P. The growth solution is a saturated melt of the multicomponents compound semiconductors to be grown as the crystal onto the seed crystal.

When DC electric current is conducted from the positive electrode 4 through the growth solution 2 to the negative electrode 7, Peltier heating or Peltier effect-based heating at the interface between the source material 5 and the growth solution 2 as well as Joule heating or Joule effect-based heating are simultaneously developed. As a result, the top portion of the source material 5 is gradually dissolved into the growth solution 2. Therefore, the composition of the growth solution 2 will be varied depending on the magnitude of the DC electric current passed through the source material. Since the composition of the growth solution 2 is variable, it is possible to vary the composition of the resulting crystals by depending upon the magnitude of the electric current.

In the growth apparatus of FIG. 3, the composition of the growth solution 2 is freely controllable by suitably increasing or decreasing the electric current, depending on the growth conditions of the crystals, and, accordingly, the uniform composition of the crystals on the seed crystal 8 can be maintained from the beginning to the end of the crystal growth step. Further, since the seed holder 9 is rotatable, it is also possible to sufficiently agitate the growth solution 2 to ensure a uniform composition. In the illustrated growth apparatus, undesirable dissolution of the seed crystal 8 due to Joule heating can be avoided, because the positive electrode 4 is not connected with the seed crystal 8, but with the carbon electrode 3.

The growth apparatus of FIG. 3 has only one source material 5. However, it may be replaced with two or more source materials. In this modification, controlled DC electric currents are separately conducted to each of the source materials. Separate application of the electric currents to each of the source materials will enable the production of crystals having more multiple components.

Another preferred embodiment of this invention is illustrated in FIGS. 4A and 4B. These drawings show liquid phase epitaxy using the SCC method of this invention.

The illustrated boat-type growth apparatus has the following characteristic constitutions: First, a carbon or graphite boat 11 is connected with a positive electrode 12 of stainless steel. A plate 14 of boron nitride (BN) as an insulator is positioned between a slider 13 of graphite and a source holder 15 of graphite. As illustrated, a top portion of the graphite source holder 15 supports the source material 17, and another end portion thereof is provided with a stainless steel electrode 16 connected with a negative electric source (not shown). The source material 17 may be, for example, InAs or GaAs plate. In the above design of the graphite boat 11, it is intended to pass the electric current only through the source material 17. A substrate 18 for epitaxial growth is carried on the graphite boat 11.

Using the illustrated graphite boat, the epitaxial growth of this invention was carried out as follows: Prior to the growth, the source material, InAs or GaAs plate 17 was held in a slit of the graphite slider 13 and was not put into the growth solution 19, In-Ga-As ternary solution saturated at 790° C., as is shown in FIG. 4A. The thickness of the growth solution 19 was about 6 mm. Pd-purified hydrogen gas was introduced into the fused silica tube set (not shown) in which the graphite boat was set.

At the start of the growth run, the furnace was heated rapidly to 20° C. above the starting growth temperature of 790° C. and the In-Ga-As ternary solution saturated at 790° C. was held for about 30 minutes to make the solution homogeneous. The furnace was then cooled at a constant cooling rate of 1° C./min by the ramp cooling method. The cooling was continued until the temperature of the furnace reached 790° C. The graphite slider 13 was then moved and the source material 17 and the growth solution 19 were brought over an InP(111)A substrate 18, as shown in FIG. 4B. The InP substrate 18 had a size of 18 mm×20 mm. Thereafter, DC electric current was conducted from the growth solution 19 to the source material 17 to start the epitaxial growth. Substantially no electric current was passed through the substrate 18 Similar to the case of FIG. 3 previously discussed, the source material 17 was gradually dissolved into the growth solution 19 due to combination of Peltier heating and Joule heating. In addition, the dissolution of the source material 17 could be freely controlled through the control of the magnitude of the electric current. Finally, an $In_{1-x}Ga_xAs$ epitaxial layer of the intended composition was grown on the InP substrate 18, because the composition of the growth solution 19 could be freely varied through the control of the electric current.

As a modification of the design of the present invention, the graphite boat of FIGS. 4A and 4B may be provided with two or more source materials. This modification of the design will be effective for increasing controllability of the composition of the growing crystals.

Figure 5:
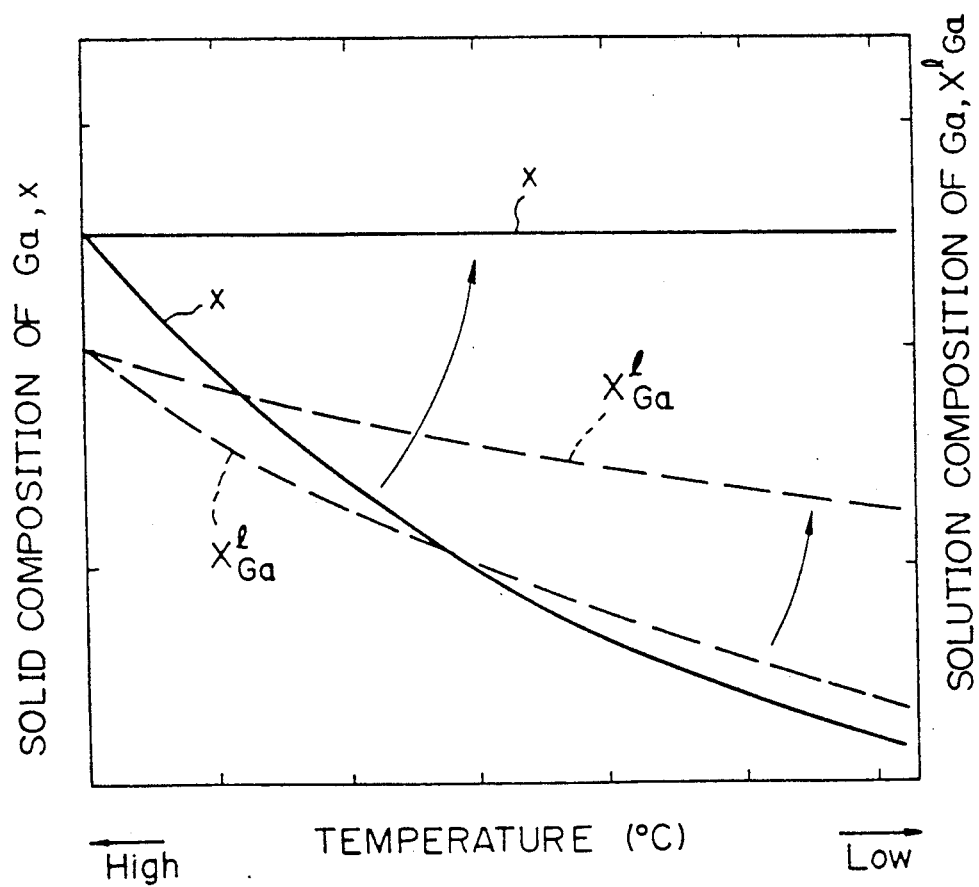
FIG. 5 shows a solid composition of Ga, x, and a solution composition of Ga, $X^l_{Ga}$, in $In_{1-x}As$ LPE layers grown by using the apparatus of FIGS. 4A and 4B, as a function of the temperature.

Furthermore, the above growth run using the graphite boat of FIGS. 4A and 4B led to the following results: In FIG. 5, the lower dotted line indicates a composition of Ga in the growth solution, namely, solution composition or atomic fraction of Ga, $X^l_{GA}$. From this line, it is apparent that Ga in the growth solution is gradually decreased with the growth of the crystals and with the decrease of the temperature Further, it can be seen from the lower solid line that Ga in the growing crystals, namely, solid composition of Ga, x, is also gradually decreased with the growth of the crystals and with the decrease of the temperature However, Ga in the growing crystals must be constant as is indicated by the upper solid line (arrow in the drawing indicates that the lower line should be shifted to the upper line). Further, to obtain the upper solid line x, it is necessary to control the solution composition of Ga in the growth solution, i.e., to shift the lower dotted line $X^l_{Ga}$ to the corresponding upper dotted line $X^l_{Ga}$.

Figure 6:
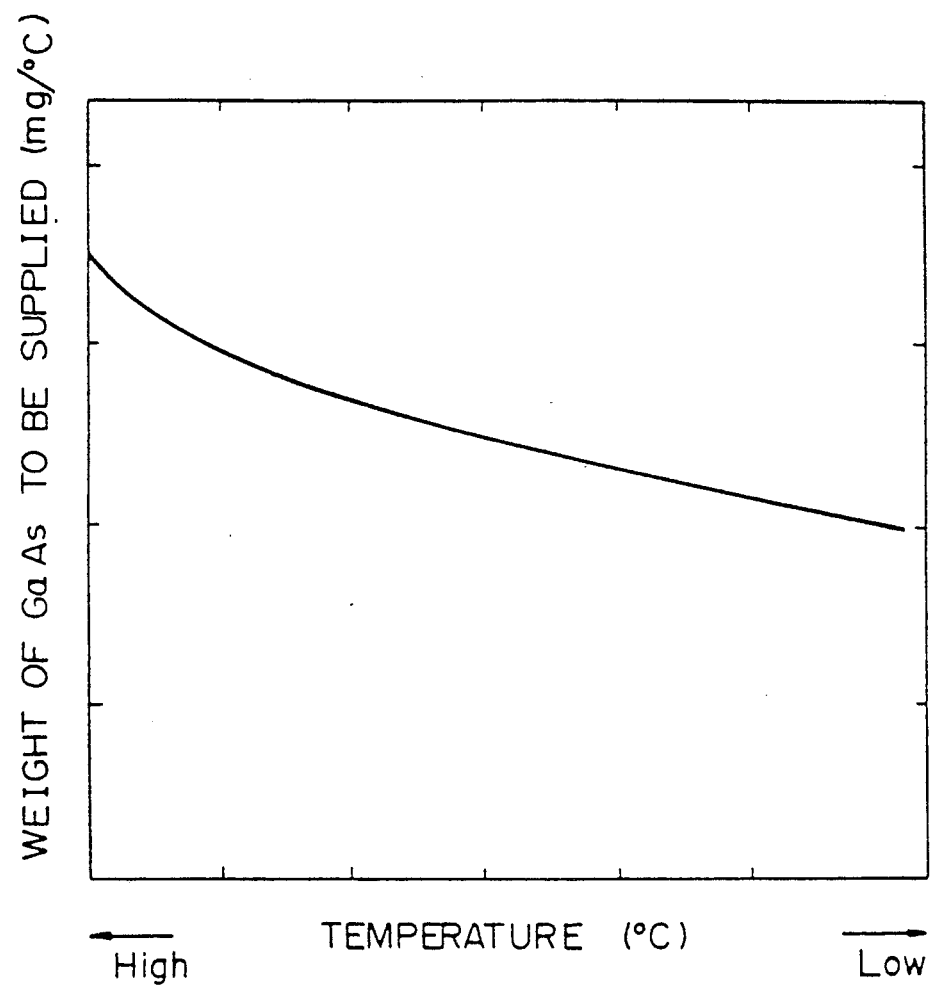
FIG. 6 shows a weight of GaAs to be supplied to the growth solution, calculated from the data of FIG. 5, as a function of the temperature.

FIG. 6 corresponds to FIG. 5, and shows a weight of GaAs to be supplied to the growth solution with the decrease of the temperature. This graph was plotted by calculating the weight of GaAs required to be supplied to the growth solution from the data on two dotted lines $X^l_{Ga}$ in FIG. 5. This graph indicates that the supply or dissolution of GaAs into the growth solution must be gradually decreased with the decrease of the temperature, and that GaAs must be supplied or dissolved into the growth solution at an initial stage of the growth.

Figure 7:
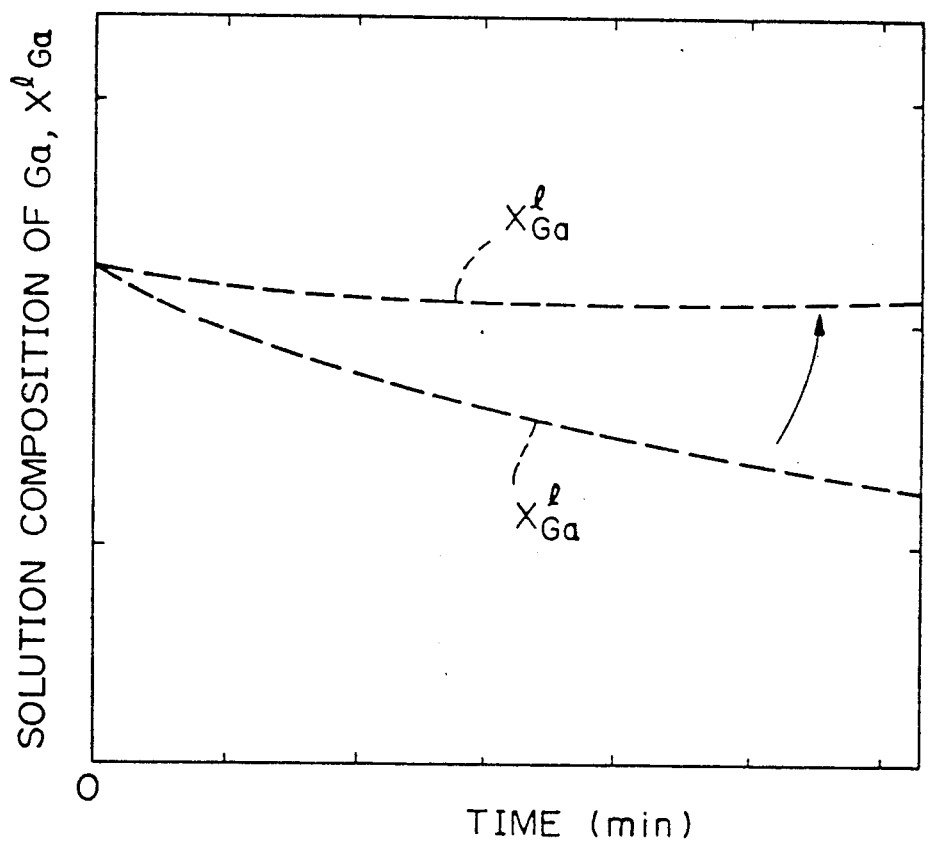
FIG. 7 shows a solution composition of Ga, $X^l{}_{Ga}$, in $In_{1-x}Ga_xAs$ LPE layers grown by using the apparatus of FIGS. 4A and 4B, as a function of the time.
Figure 8:
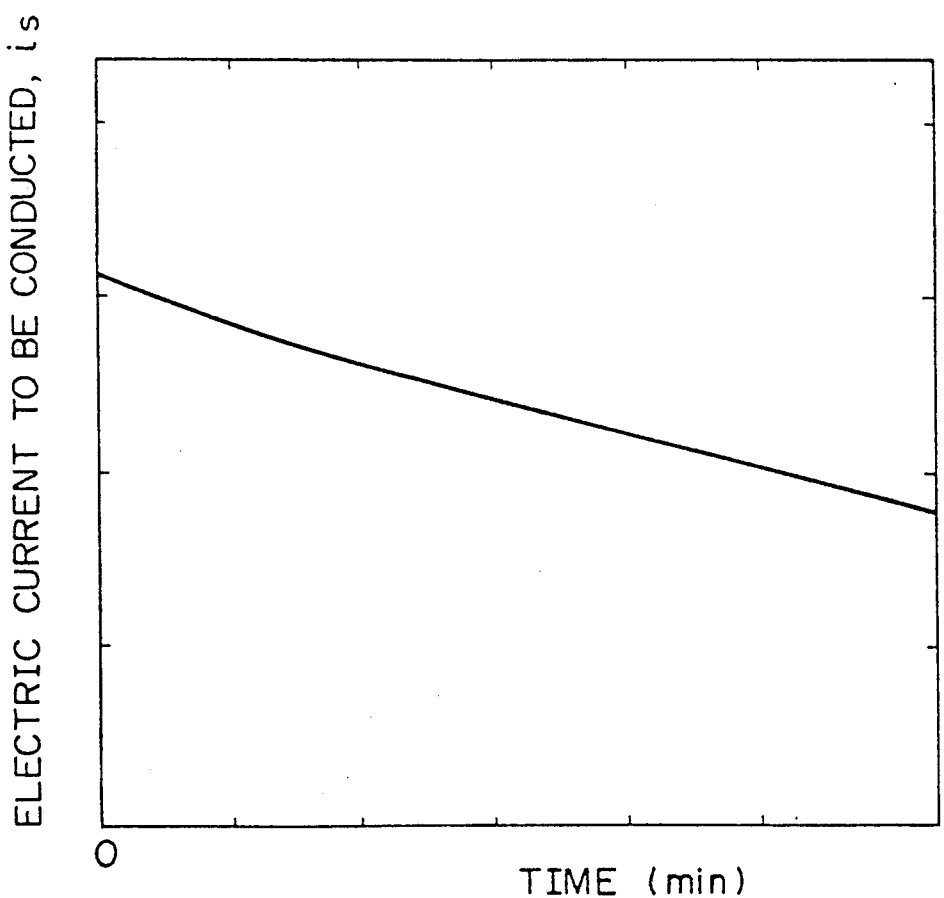
FIG. 8 shows an electric current conducted to the source material GaAs for the dissolution, calculated from the data of FIG. 7, as a function of the time.

Similarly, as shown in FIG. 7, it is concluded that a solution composition or atomic fraction of Ga in the growth solution, $X^l_{Ga}$, is gradually decreased with time, and that the lower dotted line $X^l_{Ga}$ must be shifted to the upper dotted line $X^l_{Ga}$ to maintain a composition of Ga in the growing crystals at a fixed ratio. From the data on these dotted lines, an electric current to be conducted to the source material GaAs for the dissolution can be calculated. The results are plotted in FIG. 8. FIG. 8 shows that the magnitude is of the electric current passed through the growth solution must be gradually reduced with time.

Furthermore, the previously discussed growth run was repeated to ascertain whether or not the bulk crystals or epitaxial crystals of the multicomponents compound semiconductors can be grown by the SCC method of this invention; in other words, whether or not the SCC method can be effectively used to control the composition of the resulting crystals.

Figure 9:
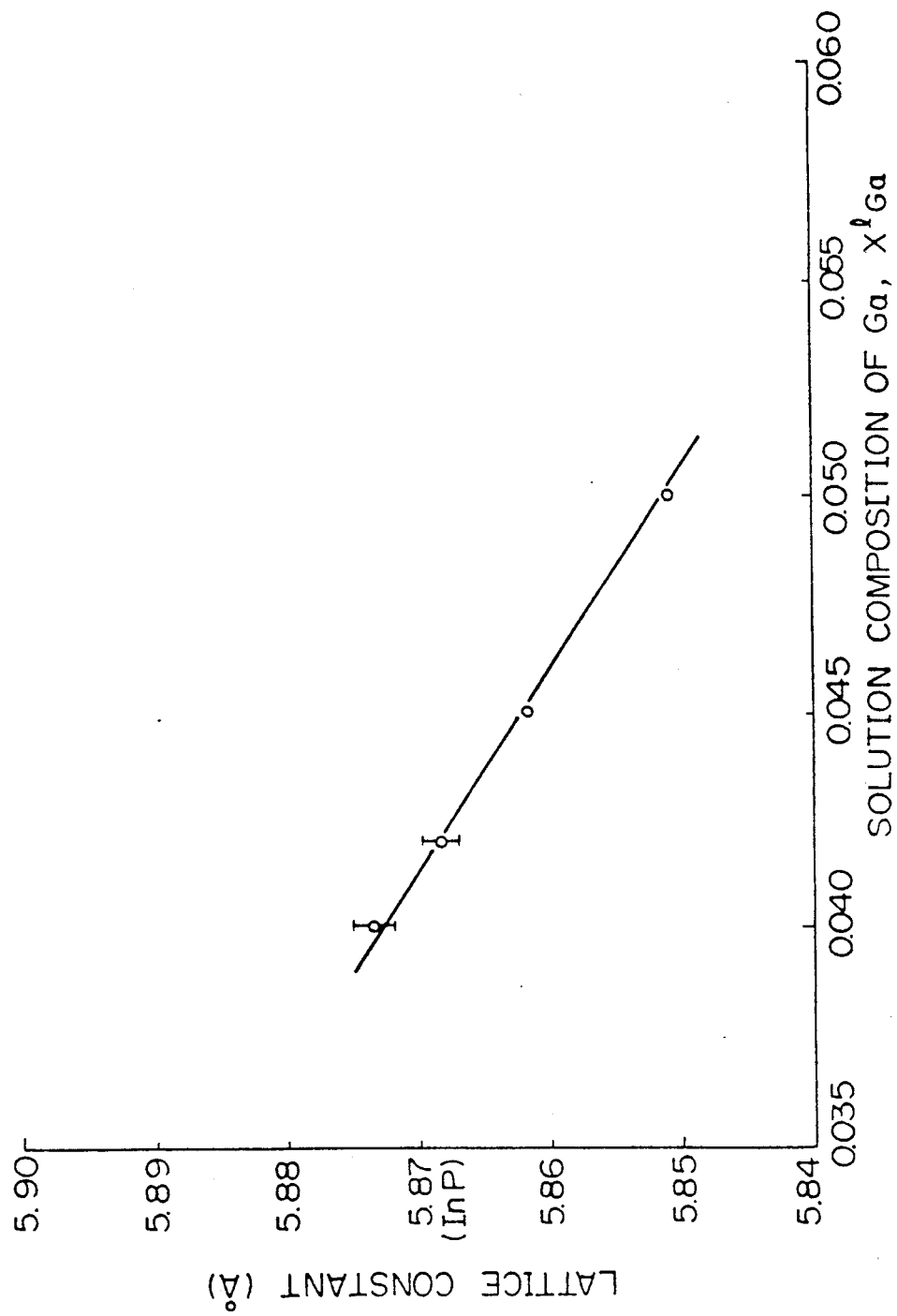
FIG. 9 shows a lattice constant of $In_{1-x}Ga_xAs$ LPE layers grown on (111)A InP substrate, as a function of the solution composition of Ga, $X^l{}_{Ga}$.

As previously described, $In_{1-x}Ga_xAs$ LPE layers were grown on the (111)A oriented InP substrate by using the InAs and GaAs plates as the source material and the In-Ga-As ternary solution saturated at 790° C. as the growth solution, respectively. The In-Ga-As growth solution had the following composition:

$$X^l_{Ga} = 0.040,$$
$$X^l_{As} = 0.170, \text{ and}$$
$$X^l_{In} = 0.790,$$

wherein $X^l_i$ (i=Ga, As or In) represents a solution composition or atomic fraction of the element i in the solution. The lattice constants (Å) of $In_{1-x}Ga_xAs$ were measured by the double-crystal X-ray diffraction technique, and plotted as a function of the solution composition of Ga, $X^l_{Ga}$. The results are shown in FIG. 9, and it is apparent that the $In_{1-x}Ga_xAs$ LPE layers are almost lattice-matched to the (111)A oriented InP substrate.

Figure 10:
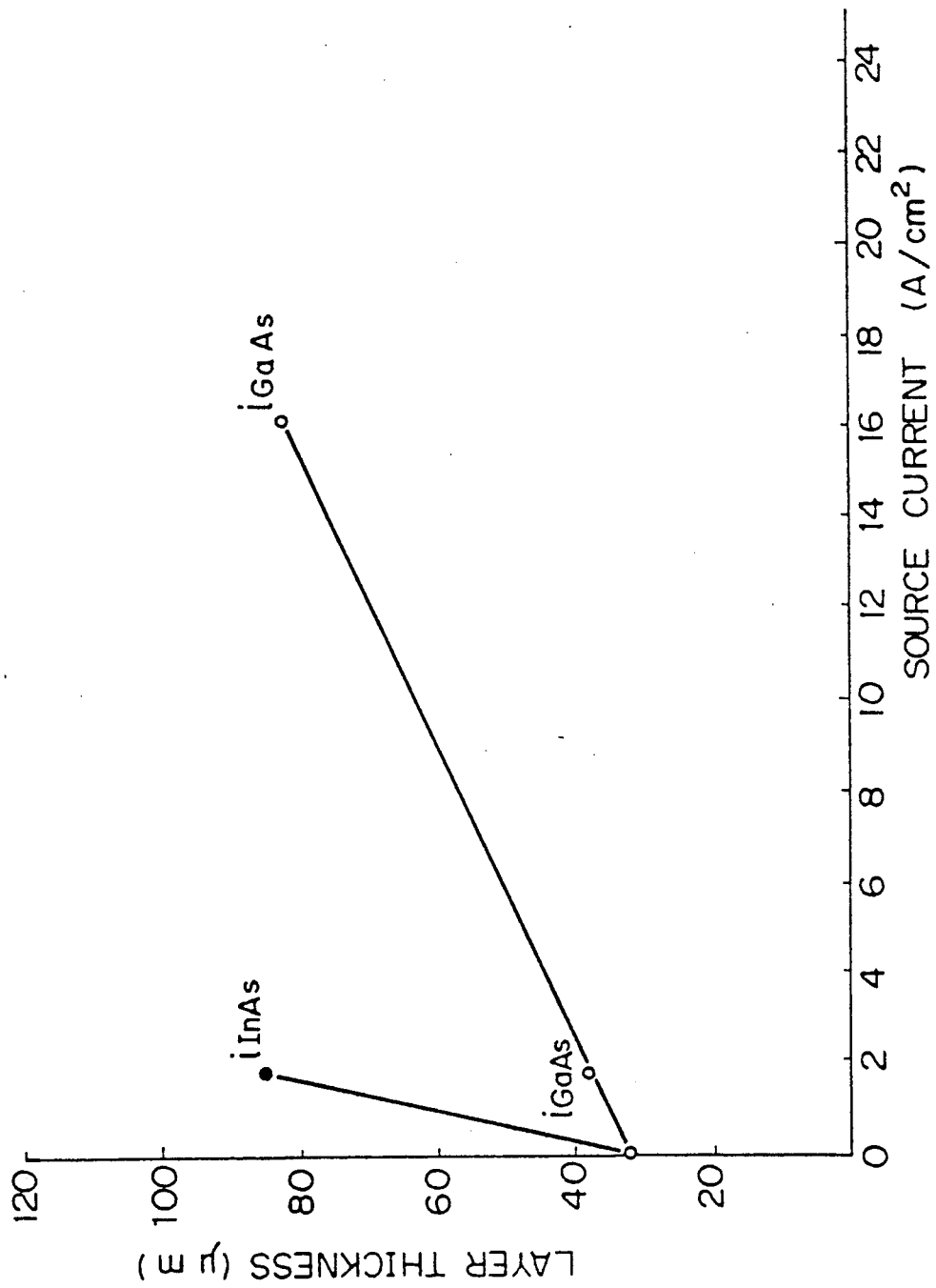
FIG. 10 shows a layer thickness of (111)A $In_{1-x}Ga_xAs$ LPE layers grown by using the apparatus of FIGS. 4A and 4B, as a function of the source current or electric current passed through the source material InAs or GaAs.

The growth run was further repeated to determine a relationship between layer thickness ($\mu$m) of (111)A $In_{1-x}Ga_xAs$ LPE layers and source current or electric current $i_s$ (A/cm²) passed through the source material InAs or GaAs. The $In_{1-x}Ga_xAs$ layers were grown on the substrates by ramp cooling from 790° C. to 760° C. for 30 minutes. The results are shown in FIG. 10.

First, when the electric current was not passed, the thickness of the $In_{1-x}Ga_xAs$ layer was 32 $\mu$m.

Second, the first growth run was repeated, except that the InAs plate was used as the source material and the electric current was passed through the InAs plate. The thickness of the layer increased rapidly and amounted to 85 $\mu$m. The average source current $i_{InAs}$ was calculated as 1.7 A/cm² (see $i_{InAs}$ line of FIG. 10), and its practical value was considered to be about ten times that of this source current due to concentration of the electric current into the dissolving portion of the source material A remarkable increase of the layer thickness 85−32=53 $\mu$m was obtained, since the dissolution of the InAs source material into the saturated growth solution and the migration of the solute elements due to electromigration had an advantageous effect on the growth of the crystals.

The second growth run was repeated except that the InAs plate was replaced with the GaAs plate as the source material. The thickness of the $In_{1-x}Ga_xAs$ layer was 82 $\mu$m. The average source current $i_{GaAs}$ was calculated as 16 A/cm² (see $i_{GaAs}$ line of FIG. 10), and its practical value was considered to be about ten times this value due to concentration of the electric current into the dissolving portion of the source material. From this result, it will be understood that, in comparison with the use of InAs as the source material, a larger electric current must be conducted through the source material, because the GaAs source material has a higher melting point than that of InAs.

As in the case of the second growth run using the InAs source material, the remarkable increase of the layer thickness 82−32=50 $\mu$m is due to the supply of solute elements from the GaAs source material and the electromigration of the As species. The former effect will be larger than the latter.

Figure 11:
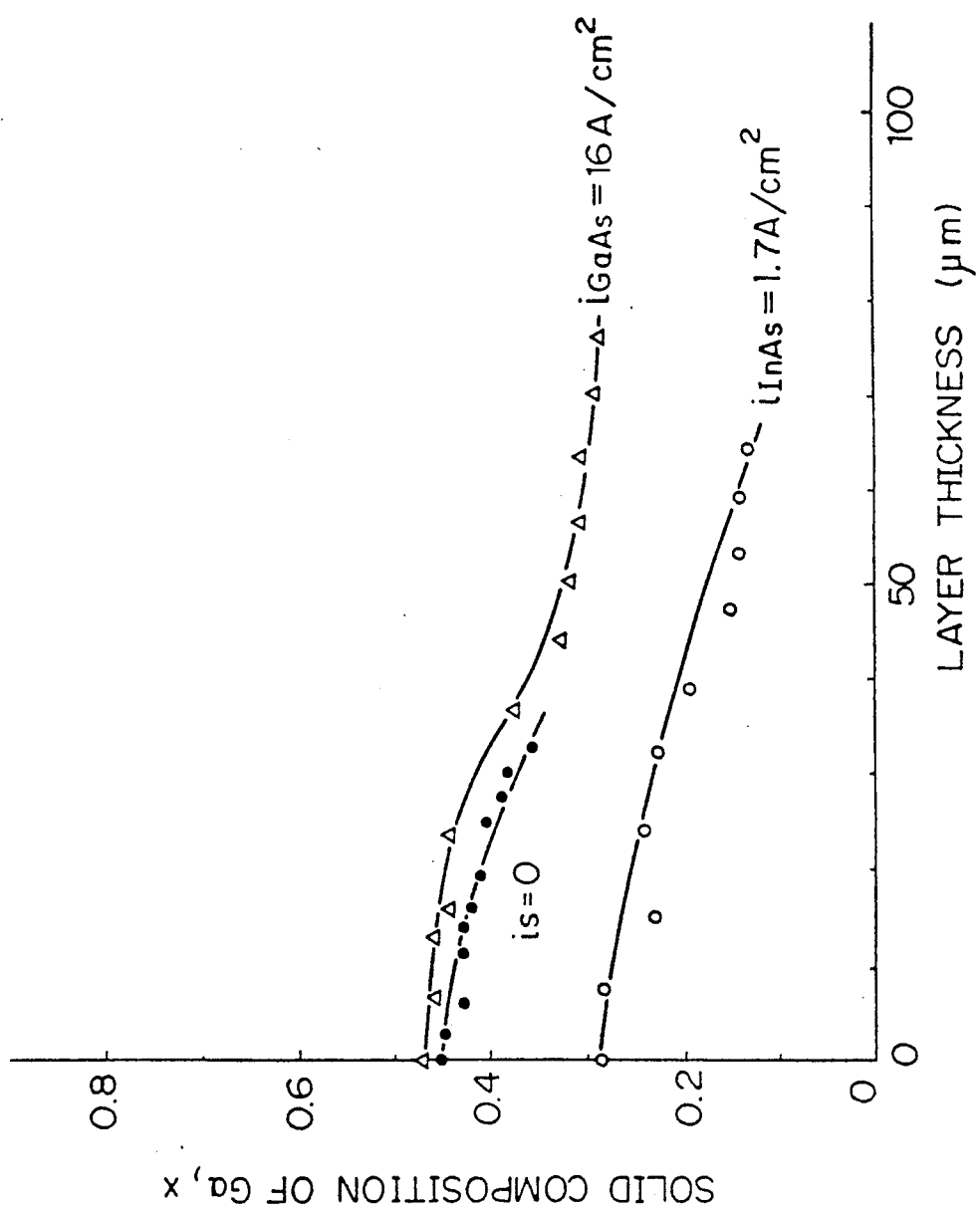
FIG. 11 shows a solid composition of Ga, x, in (111)A $In_{1-x}Ga_xAs$ LPE layers grown by using the apparatus of FIGS. 4A and 4B, as a function of the layer thickness.

From the growth run described above, a relationship between a solid composition of Ga, x, in (111)A $In_{1-x}Ga_xAs$ LPE layers and thickness (μm) of the LPE layers could also be determined. The solid composition of Ga, x, was determined by measuring a thickness-wise variation of the composition of the grown LPE layers with XMA (X-ray microanalysis). The plotted results are shown in FIG. 11.

When a source current $i_s$, i.e., electric current passed through the source material, was 0 A/cm$^2$, the solid composition x of the LPE layer varied from 0.45 to 0.35 with the increase of the layer thickness. It will be observed from the solid dots line ($i_s=0$) of FIG. 11 that the solid composition of Ga in the LPE layer is decreased with the growth of the crystals due to depletion of the Ga in the growth solution.

When the source current of 1.7 A/cm$^2$ was passed through the InAs source material, the solid composition x at the beginning of the crystal growth was 0.28. The remarkably reduced x value was obtained because of excessive dissolution of the InAs source material into the In-Ga-As growth solution Then, the solid composition x was gradually decreased with the increase of the layer thickness.

Further, when the source current of 16 A/cm$^2$ was passed through the GaAs source material, the solid composition x at the beginning of the crystal growth was 0.47, i.e., 0.02 above that of the solid dots line ($i_s=0$). This is because the GaAs source material is slightly dissolved into the growth material as a result of conduction of the electric current. Also, it was found from the above experiments that the thickness-wise depletion of Ga was more gentle than that of the solid dots line.

The GaAs source material was little dissolved into the growth solution due to its higher melting point. Accordingly, the variation of the composition x for the GaAs case was much less than that of the InAs case.

It will be sufficiently understood from the above descriptions that this invention can be effectively used to control the composition of the growing crystals. In addition, according to this invention, it is possible to control a layer thickness of the growing crystals and to grow the crystals at a lower temperature generally insufficient to conduct the crystal growth.

For example, in the liquid phase epitaxial crystal growth process, an epitaxial crystal layer can be grown on the substrate by immersing the source material in the growth solution saturated at a predetermined temperature, and then conducting the electric current to the growth solution to dissolve the source material into the growth solution, thereby producing a supersaturated growth solution. This means that the epitaxial growth of the crystal layer depends on the time during which the electric current is conducted tn the source material, and also on the magnitude of the electric current. Accordingly, a layer thickness of the growing crystals can be controlled by changing the time for current supply.

Also, the growth solution, if saturated at a lower temperature, can be changed to the supersaturated growth solution by passing the electric current through the source material, because the source material is melted by the Peltier and Joule heating, and is dissolved into the growth solution. Accordingly, this invention can be effectively used in the crystal growth at a lower temperature.

Figure 12:
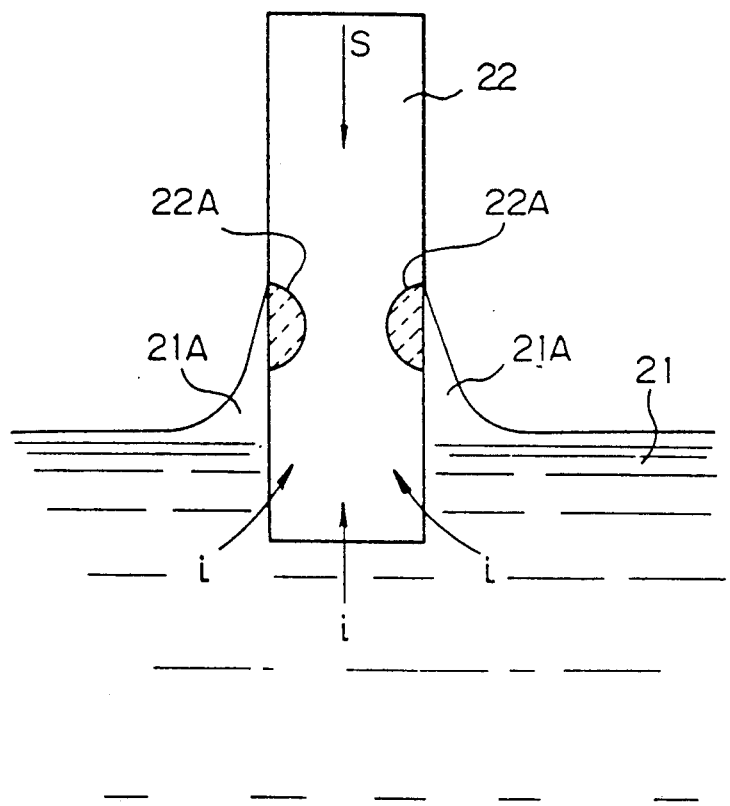
FIG. 12 illustrates undesirable dissolution of the source material.

However, unfortunately, undesirable dissolution of the source material, as shown in FIG. 12, may be caused in the practice of this invention, though such a defect can be avoided through improvement of the configuration of the source material and immersion of the source material in the growth solution, as described hereinafter.

Referring now to FIG. 12, the source material 22 is immersed in the growth solution 21 Arrow S indicates a direction of the immersion of the source material 22 and arrow i indicates the flow of the electric current. As a result of the immersion, the source material 22 tends to form risen portion 21A of the growth solution 21 due to capillary action. The risen portion 21A surrounding the source material 22 has Peltier-induced heat which will then heat a limited portion 22A of the source material 22 adjacent to the risen portion 21A, since Peltier heat is substantially not transferred to the growth solution. Practically, the temperature of the portion 22A is higher than that of the lower part of the top portion of the source material 22. As a result, the portion 22A of the source material 22 is first dissolved in the growth solution 21. The dissolution of the portion 22A will finally result in the separation of the top portion of the source material 22.

To prevent the undesirable dissolution of the source material shown in FIG. 12, it is proposed to use a rod-shaped source material and to dip only a lower part of the top portion of the source material into the growth solution. When the flow of the electric current through the source material was stopped due to dissolution of the top portion, the source material can be then slightly lowered so that its top portion is again in contact with a surface area of the growth solution. If this movement step of the source material is continuously repeated, undesirable separation of the source material during the crystal growth can be prevented. Accordingly, the source material can be completely used, with no remainder.

In addition to this improvement, the inventors unexpectedly found that, if a source material is combined with a wall of the container for the growth solution, such as crucible and boat, a small contact area between the source material and the growth solution can be constantly and easily maintained without additional operations such as lowering of the source material depending upon its dipped depth, or the like. Thus also preventing undesirable dissolution of the source material. The source material is completely depleted without breakage during the crystal growth.

Figure 13:
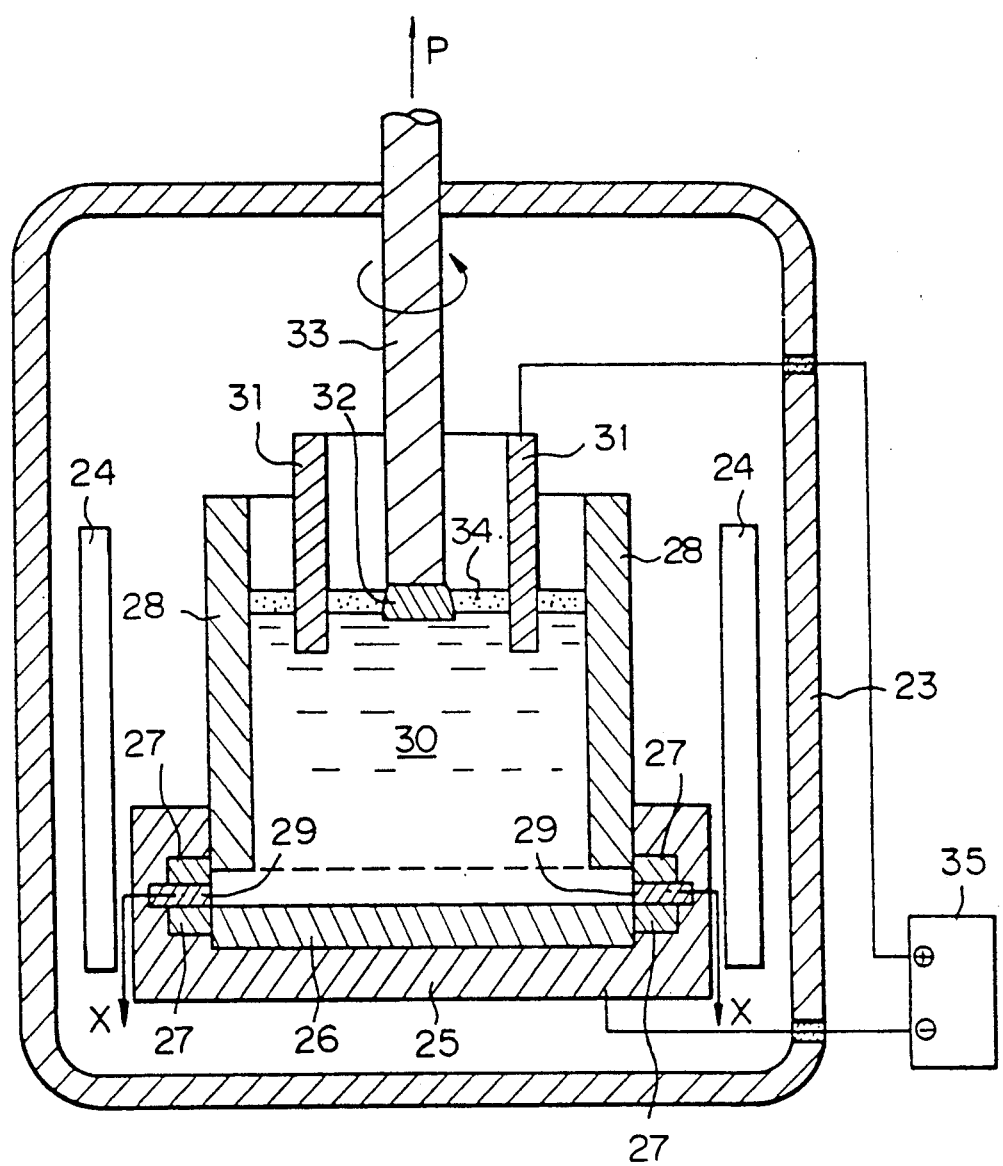
FIG. 13 is a cross-sectional view of the growth apparatus according to another preferred embodiment of this invention.

FIG. 13 illustrates a crystal pulling system-based crystal growth apparatus according to this invention, in which a source material is disposed in combination with the wall of the crucible. As illustrated, the crucible of boron nitride (BN) comprises a cylindrical side wall 28 and a disc-shaped bottom wall 26. A gap between the side wall 28 and the bottom wall 26 is closed by a crucible support 25 of graphite having embedded therein the source material 29, hereinafter described with reference to FIG. 14 which shows a cross-sectional view of the apparatus taken along the line X—X of FIG. 13. The BN crucible is heated with a surrounding heater 24 such as a carbon heater or high frequency (HF) coil. In the figure, reference number 23 indicates a pressure oven. And also, reference number 35 indicates a current controller which is used to control the electric current so as to maintain a desired composition of the growth solution As shown in FIG. 13, a lower part of the top portion of the cylindrical graphite electrode 31 connected with a positive electric source and the seed crystal 32 supported by the rotatable seed holder 33 are immersed in the growth solution 30. The pulling direction of the seed crystal 32 is indicated by the arrow P. The growth solution 30 is a solution of the multicomponents compound semiconductors for use in the crystal growth To avoid decomposition, the growth solution 30 is sealed with a covering material 34 of boron trioxide ($B_2O_3$).

Figure 14:
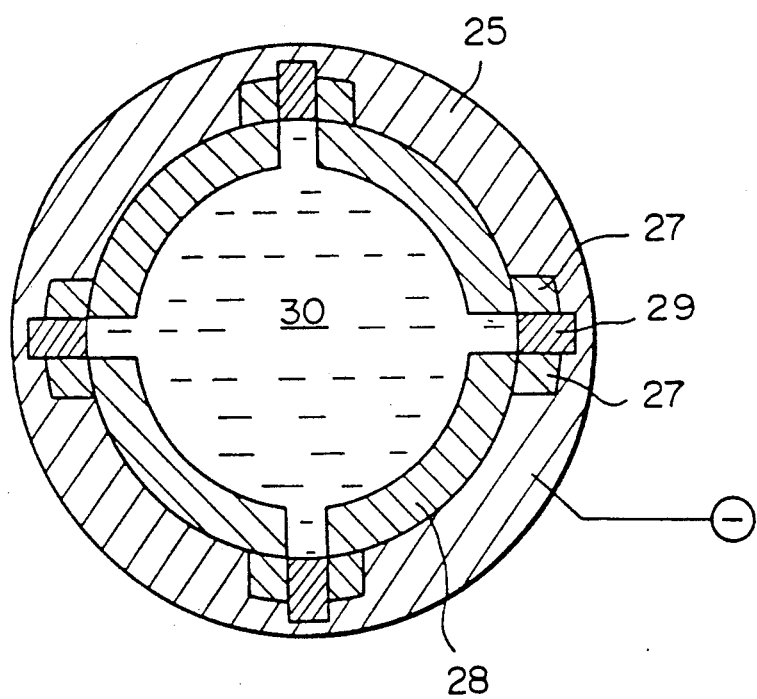
FIG. 14 is a cross-sectional view of the growth apparatus taken along the line X—X of FIG. 13.

Referring now to FIG. 14, the electrically insulating cylindrical side wall 28 and the electrically conductive crucible support 25 surrounding a lower outer surface of the crucible are concentrically disposed, and the crucible support 25 is freely rotatable. The crucible support 25 is connected with a negative electric source. Four source materials 29 are embedded in an inner surface of the crucible support 25 together with BN plates 27, each of which encloses four adjacent surfaces of the source material 29. These source materials are opposed to each other, and their positions correspond to those of the gaps formed between two adjacent parts of the side wall 28. The arrangement of the source materials 29 and the use of the rotatable seed holder 33 as in FIGS. 13 and 14 is most advisable, since this results in a uniform distribution of the dissolved source materials 29 in the growth solution 30. It is important that only a small surface of the source material 29 is exposed to the growth solution 30, and that the small exposure of the surface of the source material 29 to the growth solution 30 is constantly maintained during the crystal growth.

Before the growth run, the crucible support 25 is rotated in such a manner that an exposed surface of the source material 29 embedded therein does not come into contact with the growth solution 30. The surface of the source material 29 is in contact with the outer surface of the BN side wall 28. Under this condition, the growth solution 30 is heated to a desired temperature with the heater 24. When beginning the growth run, the crucible support 25 is again rotated to move the source materials to the positions shown in FIG. 14. When DC electric current is supplied from the graphite electrode 31 to the source materials 29 through the growth solution 30, Peltier heating and Joule heating at the interface between the source materials 29 and the growth solution 30 cause a gradual dissolution of the exposed top portion of the source materials. The dissolution of the source materials can be controlled by adjusting the electric current supplied. As a result, the composition of the growing crystals also can be effectively controlled.

Figure 15:
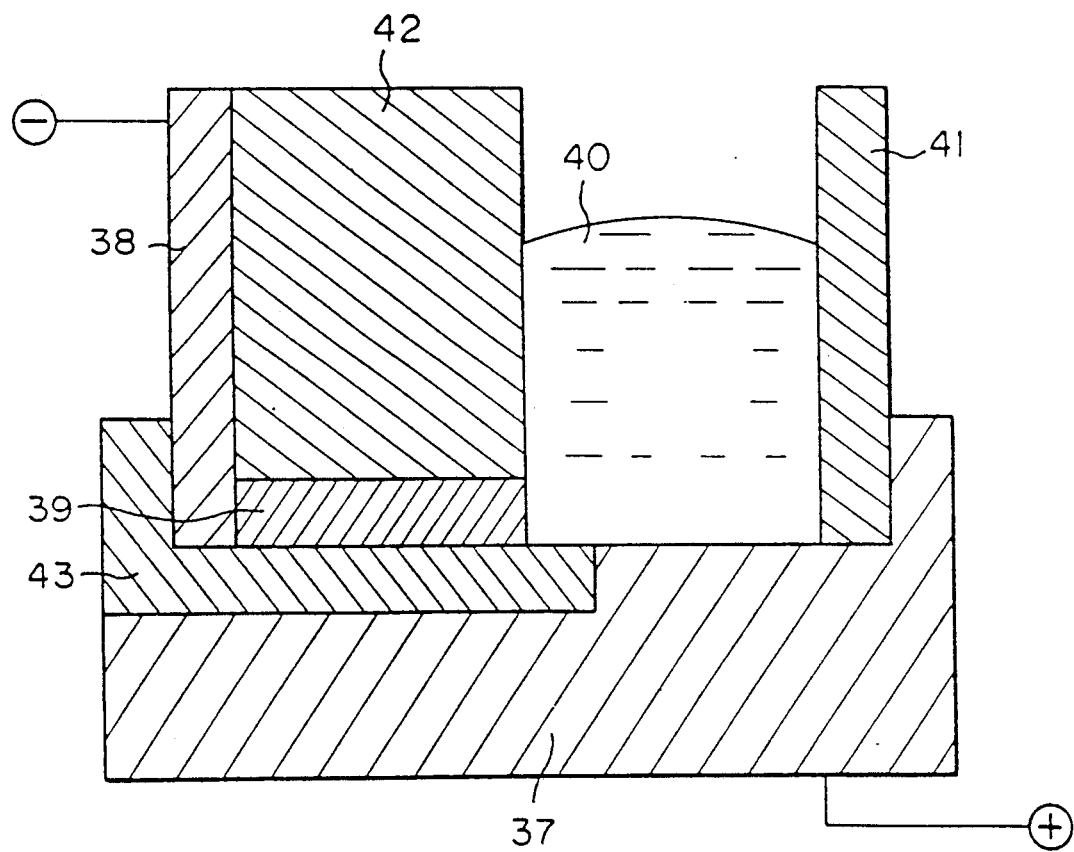
FIG. 15 is a cross-sectional view of the boat-type growth apparatus according to still another preferred embodiment of this invention, taken along the line Y—Y of FIG. 16.
Figure 16:
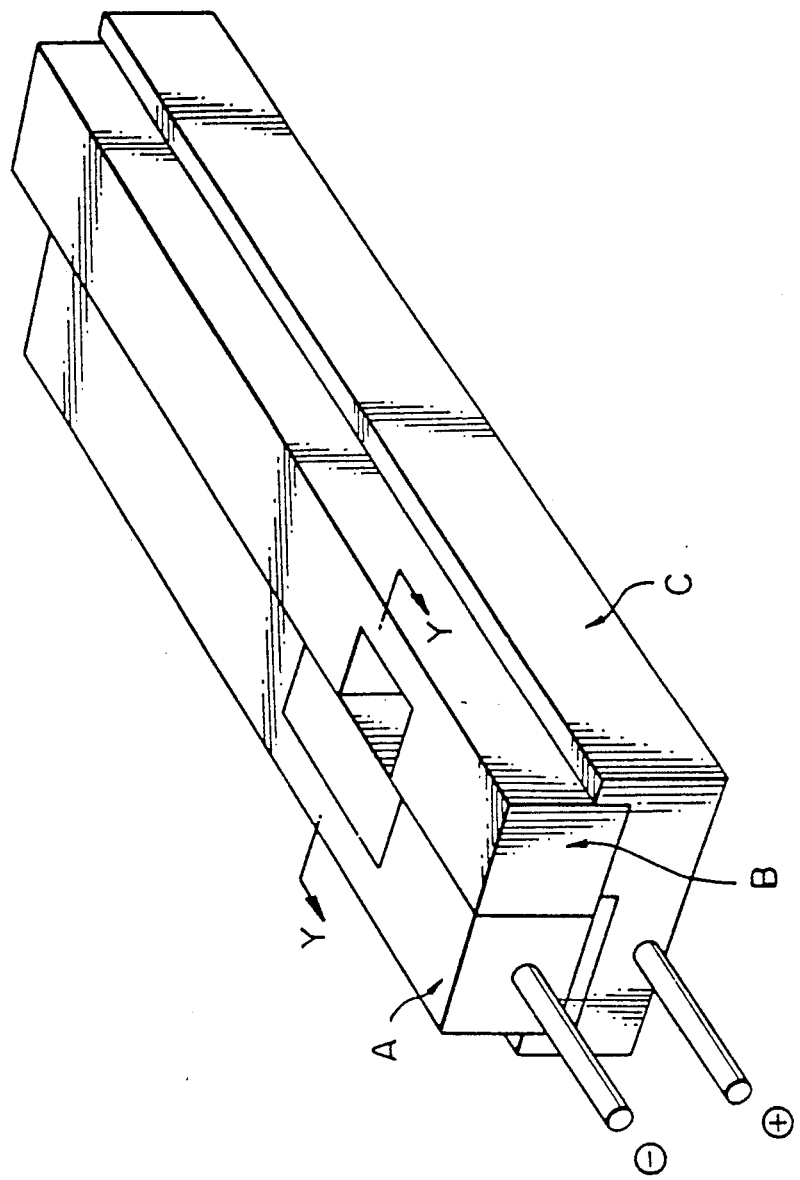
FIG. 16 is a schematic view of the growth apparatus of FIG. 15.
Figure 17:
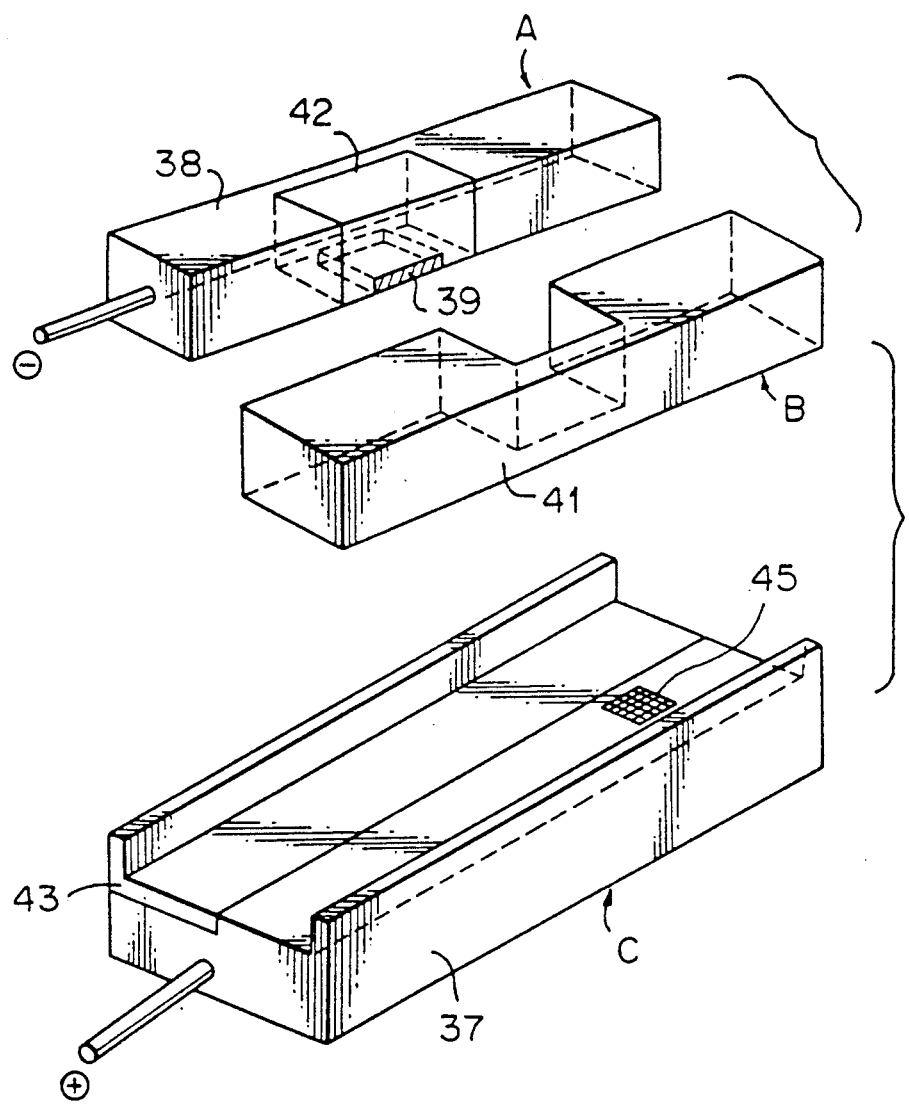
FIG. 17 is a schematic exploded view of the growth apparatus of FIG. 16.

FIGS. 15, 16, and 17 illustrate a liquid phase epitaxial growth apparatus according to this invention, in which a source material is disposed in combination with the graphite boat.

The constitution of the boat is apparent from FIG. 17. The boat consists of three parts: A, B, and C. Part A is a graphite slider 38 with boron nitride (BN) block 42 as an insulator. A source material 39 in the form of a plate is surrounded by the BN block 42. A negative current electrode made of stainless steel is screwed into the graphite slider 38. Part B is a boron nitride (BN) slider 41 with a cut portion into which a growth solution is put. Part C is a graphite boat holder 37 with a boron nitride (BN) plate 43 and a positive current electrode made of stainless steel. The substrate 45 is set in a pit on the boat holder 37. These parts A, B, and C are assembled into a boat as shown in FIG. 16. A cross-section of this boat taken along line Y—Y of FIG. 16 is shown in FIG. 15.

In FIG. 15, a surface of the plate-shaped source material 39 is in contact with the growth solution 40 and the opposite surface thereof is bonded to the graphite slider 38 through the In or Ga melt (not shown). The other four surfaces of the source material 39 are covered with the BN block 42 and BN plate 43. The growth solution 40 is surrounded by the BN slider 41, BN block 42, and BN plate 43, except where its bottom portion is in contact with the graphite boat holder 37. Accordingly, during the growth run, the electric current flows in the following order: positive current electrode, boat holder 37, growth solution 40, source material 39, graphite slider 38, and negative current electrode. The surface portion of the source material 39 exposed to the growth solution 40 is gradually dissolved by the heat produced through the Peltier effect at the interface between its surface portion and the growth solution, and then introduced into the growth solution. The amount of the solute elements introduced into the solution is freely controllable depending upon the magnitude of the electric current.

From FIGS. 15, 16, and 17 and their explanations described above, it will be understood that the surface portion of the source material in contact with the growth solution has a very small area and that this small area is constantly maintained without variation during the growth run, though a position of the surface portion is slowly regressed as a result of the dissolution of the material. This is because the four surfaces of the source material are covered with the BN block and plate, and also a cross-section of the material is constant. The thickness of the source material is contemplated to be more than about 300 $\mu$m, since such a thickness is effective for assisting the introduction of the growth solution into the recesses formed through the regress of the surface of the material.

Using the above-described boat, an $In_{1-x}Ga_xAs$ LPE layer was formed on the (111)A-oriented InP substrate to ascertain the effects of the boat according to this invention. As a growth solution, the In-Ga-As ternary solution having the following composition was used:

$$X^l_{Ga} = 0.040,$$

$$X^l_{As} = 0.170, \text{ and}$$

$$X^l_{In} = 0.790,$$

wherein $X^l_i$ (i=Ga, As or In) represents an atomic fraction of the element i in the solution. The materials used herein had the following weights:

| | | |
|---|---|---|
| In | = | 1.991 g, |
| InAs | = | 0.64806 g, and |
| GaAs | = | 0.15201 g. |

The GaAs plate as the source material had a thickness of 1 mm, and a cross-section of 1.7 cm×0.1 cm.

First, the In-Ga-As ternary solution, without coming into contact with the GaAs source plate, was heated to a temperature of 810° C. to make a homogeneous solution. Then, the temperature of the solution was reduced to 790° C. This temperature was maintained, and the solution was brought into contact with the GaAs plate by moving the graphite slider A DC. electric current of 10 A was supplied from the solution to the GaAs plate for one minute. The source current or electric current measured at the interface between the solution and the GaAs plate was 59 A/cm². A top end portion of the GaAs plate was dissolved into the growth solution.

Then, the BN slider was moved to bring the growth solution into place a cut portion over the InP substrate The epitaxial growth of $In_{1-x}Ga_xAs$ crystal was performed at a growth temperature of 790° C. for 10 sec by the stepwise cooling method. An $In_{1-x}Ga_xAs$ LPE layer having a thickness of 0.7 μm lattice constant: 5.875 $\sqrt[3]{}$ and wavelength: 1.663 μm was obtained.

The above-described first growth run was reported except that a DC electric current of 30 A was supplied for one minute. The source current was determined to be 176 A/cm². For this second growth run, it was observed that a larger amount of GaAs was dissolved into the growth solution in comparison with the first growth run, and that, while the top end of the GaAs plate was regressed with time due to dissolution of the plate, an intimate contact between the top end and the solution was insured and therefore the electric current was constantly supplied from the start to the end of the current supply.

Since the Ga-rich growth solution resulted in the second growth run, the resulting $In_{1-x}Ga_xAs$ LPE layer showed a small lattice constant of 5.853 Å and a short wavelength of 1.616 μm. The LPE layer was enriched with Ga.

Figure 18:
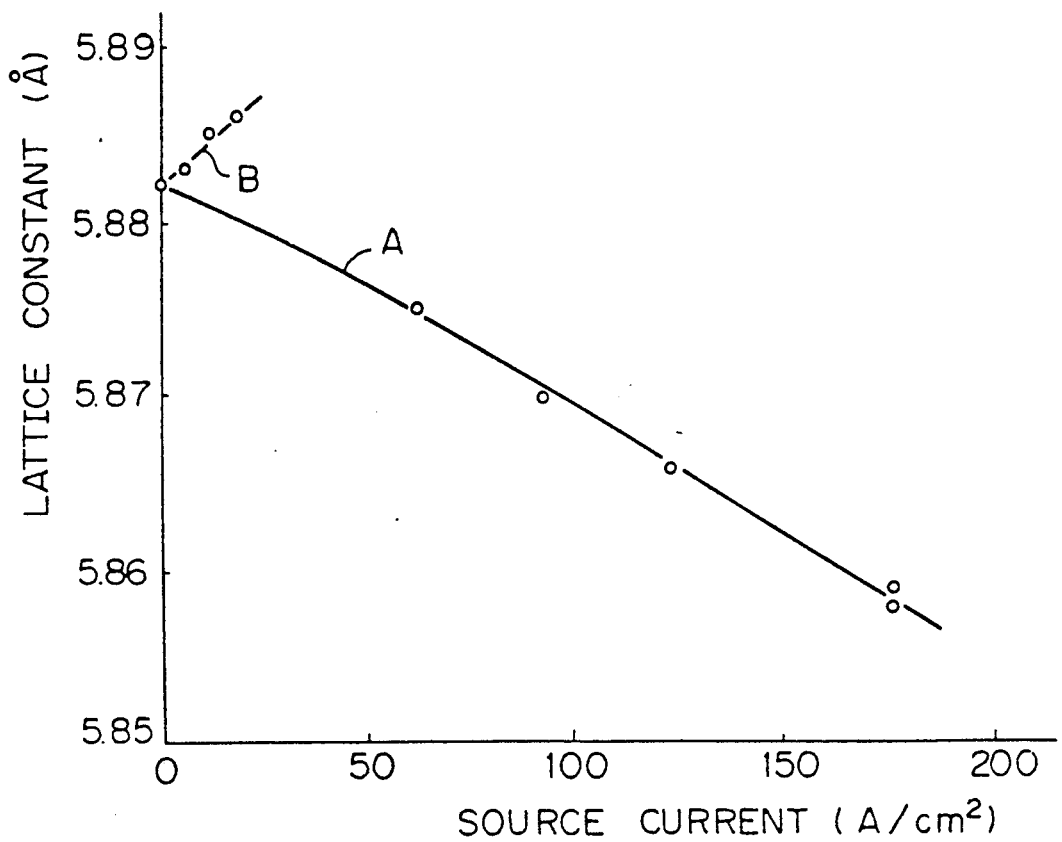
FIG. 18 shows a lattice constant of (111)A $In_{1-x}Ga_xAs$ LPE layers grown by using the apparatus of FIGS. 15, 16 and 17, as a function of the source current or electric current passed through the source material GaAs or InAs.

These results are plotted in FIG. 18. Namely, FIG. 18 shows a lattice constant (Å) of the LPE layer as a function of the source current (A/cm²). The characteristic line A indicates the use of the GaAs source plate, and line B indicates the use of the InAs source plate.

The data on lines A and B of FIG. 18 indicates that, for the GaAs source plate, a lattice constant of the resultant InGaAs LPE layer is reduced as the source current is increased, since the LPE layer is enriched with Ga in proportion to the increase of the source current. For the InAs source plate, a lattice constant of the InGaAs LPE layer is rapidly increased due to formation of the In-rich LPE layer From this data, it is apparent that the solute elements which are introduced into the growth solution as a result of the supply of the electric current and dissolution of the source material can effectively act on the formation of the LPE layer.

Figure 19:
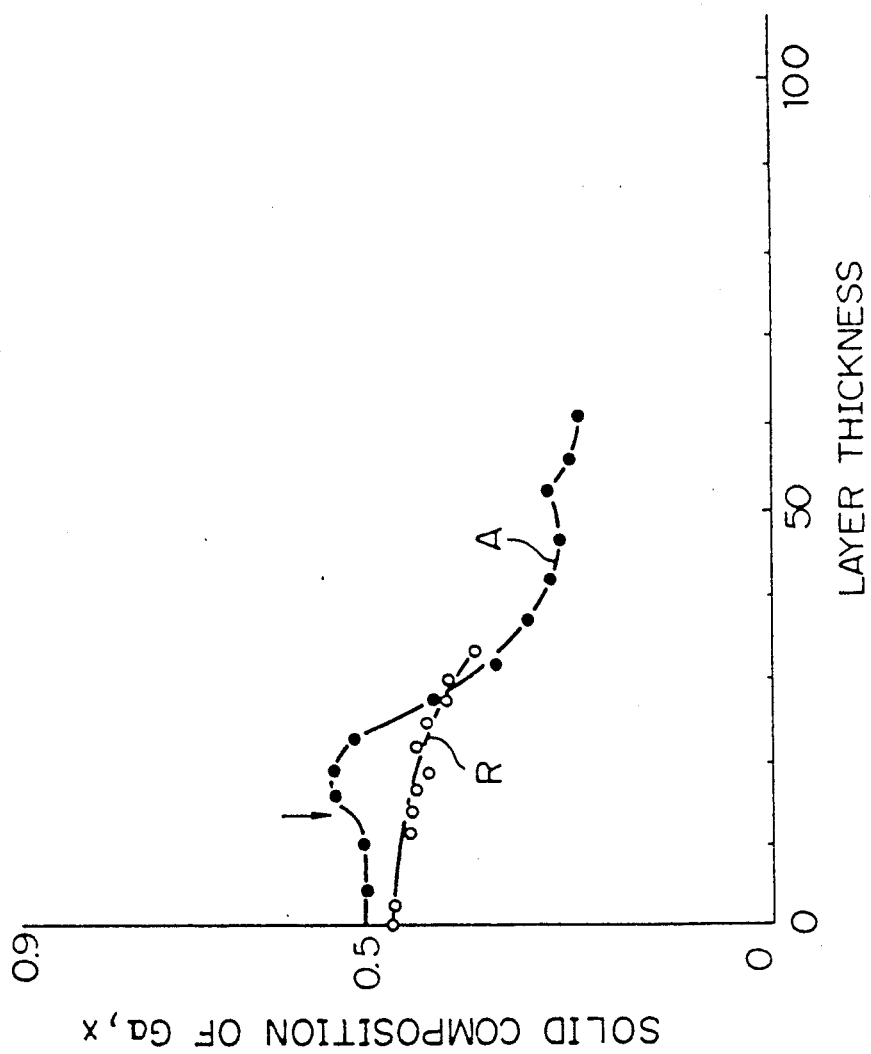
FIGS. 19 and 20 each show a solid composition of Ga, x, in (111)A $In_{1-x}Ga_xAs$ LPE layers grown by using the apparatus of FIGS. 15, 16 and 17, as a function of the layer thickness of the LPE.
Figure 20:
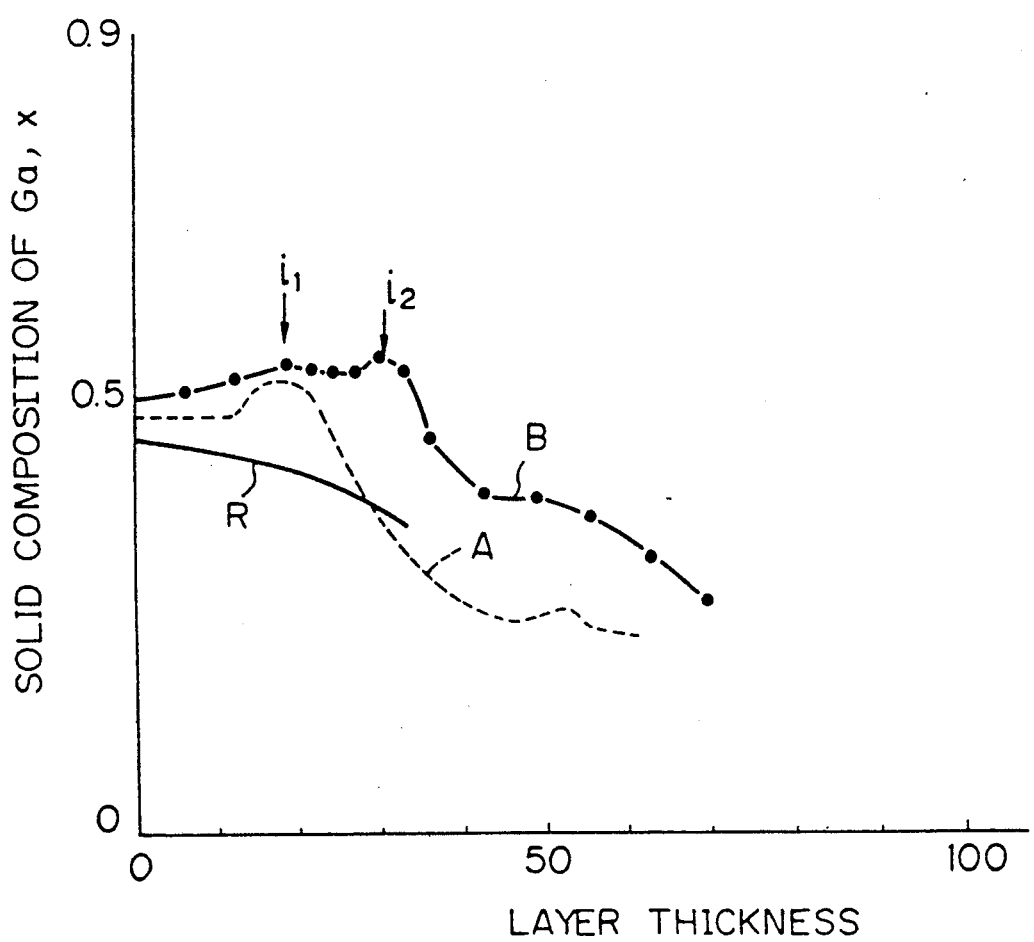

Similarly, FIGS. 19 and 20 each showing a solid composition of Ga, x, in (111)A $In_{1-x}Ga_xAs$ LPE layer as a function of the layer thickness (μm) which was measured from the interface between the LPE layer and the InP substrate were obtained.

In FIG. 19, the characteristic line R (control) shows the solid composition of Ga in the LPE layer grown without a supply of the electric current, namely, by only the ramp cooling method. As shown, the solid composition of Ga, x, varies from 0.45 to 0.35 due to consumption of the Ga in the grown solution. In $In_{1-x}Ga_xAs$ contrast, the characteristic line A (this invention) shows the solid composition of Ga in the LPE layer grown from the growth solution in which solute Ga and As were supplied by dissolving the GaAs source plate through Peltier heating. This epitaxial layer was grown by cooling the solution from 789° C. to 760° C. through the ramp cooling method at a constant cooling rate of 1° C./min. At 785° C. (point indicated by arrow), the epitaxial growth was interrupted by separating the growth solution from the substrate and bringing it in contact with the GaAs source plate. The electric current of 88 A/cm² was supplied through the source plate for 2 minutes to dissolve the GaAs source. Then, the epitaxial growth occurred again by bringing the solution over the substrate As shown in FIG. 19, sufficient amounts of solute Ga and As to adjust the compositional gradient can be supplied into the growth solution by the SCC method.

In FIG. 20, the characteristic line B indicates an example of this invention in which the LPE layer was grown by cooling the growth solution from 789° C. to 760° C. by the ramp cooling method at a constant cooling rate of 1° C./min. The epitaxial growth was interrupted twice at 780° C. (arrow $i_2$) and at 770° C. (arrow $i_2$). The electric current of 134 A/cm² was supplied through the GaAs source plate for 2 min at 780° C. and for 3 min at 770° C. to supply solute Ga and As into the growth solution. Therefore, two humps appear on the curve of the composition variation, as shown in FIG. 20. The characteristic line R shows the composition variation of the LPE layer grown by only ramp-cooling, and the characteristic line A is identical with that of FIG. 19.

Figure 21:
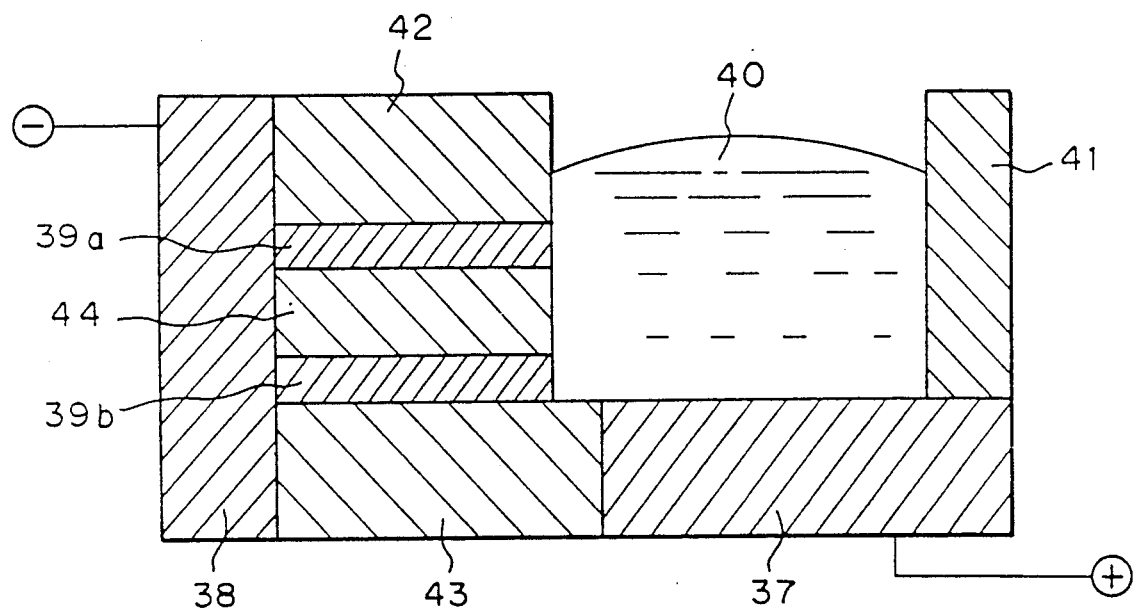
FIG. 21 is a cross-sectional view of the boat-type growth apparatus according to still another preferred embodiment of this invention.

The graphite boat illustrated in FIGS. 15, 16, and 17 may be modified to that of FIG. 21. The boat of FIG. 21 is characterized by two source plates 39a and 39b sandwiched between the boron nitride plates. The detailed explanation of this boat will be omitted, since the constitution of the boat has been previously described with reference to the similar boat of FIGS. 15, 16, and 17. This modification demonstrates that the number of source plates may be increased, if desired, insofar as it does not adversely effect the electric current to be supplied to the source plates.

This invention will be fully understood from the above detailed description. In addition, the effects of this invention are summarized as follows.

According to this invention, solute elements can be further introduced into a saturated growth solution by dissolving the source material containing the solute elements with Peltier heating and Joule heating. Peltier heating and Joule heating are induced by supplying the electric current from the growth solution to the source material.

When the electric current supplied to the source material is increased or decreased, the composition of the growth solution can be freely varied depending upon the variation of the electric current, and, accordingly, the composition of the resulting crystal layer can be controlled. This means that a crystal layer having a uniform composition can be grown with good reproducibility.

In addition, the thickness of the crystal layer can be freely controlled by controlling the magnitude of the electric current. For example, if the amount of the source material is sufficiently increased, an infinitely thicker layer of the crystals can be grown in comparison with the prior art method. This is particularly effective to produce bulk crystals of the multicomponents compound semiconductors.

This invention can be suitably used in the crystal growth process to be carried out at a lower temperature, since, according to this invention, the growth solution saturated at the lower temperature can be changed to become supersaturated by dissolving the source material immersed in the solution. For example, according to this invention, the crystal growth of InP or GaSb at a temperature lower than 500° C. can be attained.

Further, superlattice structure having a heterojunction can be realized when two or more growth solutions are changed to become supersaturated, and these supersaturated growth solutions are used alternately. Furthermore, a direct growth of InP on the InGaAs or InGaAsP crystals can be easily realized, although this was difficult in the prior art. Additionally, two or more InP layers having different carrier densities can be easily realized, and heterojunctions of AlGaSb-GaSb or AlGaAs-GaAs also can be realized.

Since this invention enables an area of the source material exposed to the growth solution to be made both very and sufficiently small, it is possible to efficiently dissolve the source material into the solution. This invention also enables a constant contact to be maintained between the source material and the growth solution and the avoidance of undesirable dissolution of the source material, since four surfaces of the material other than the two end surfaces are surrounded by the insulating material.

I claim:

1. An apparatus for growing crystals of a three or more multicomponent compound semiconductor from its growth solution on a seed crystal or substrate, which apparatus comprises a container for said growth solution, a semiconductor seed crystal or substrate disposed within said container, a first electrode, at least one source material each of which contains at least one element which is essential to complete said compound semiconductor, one end of said source material being arranged to be immersed in said growth solution and another end of said source material being connected with said first electrode, and a second electrode arranged to be immersed in said growth solution and arranged to be connected to a source of DC electric current such that DC electric current is conducted from said second electrode, through the growth solution and through said source material to said first electrode, said second electrode being separately disposed from the seed crystal or substrate such that DC electric current is not passed through said seed crystal or substrate.

2. An apparatus as stated in claim 1, in which said container is in the form of a boat.

3. An apparatus as stated in claim 1, in which said source material is a part of a wall of said container.

4. An apparatus as stated in claim 2, in which said source material is a part of a wall of said container.

5. An apparatus as stated in claim 1, 2, 3 or 4 in which said second electrode or an electrically conductive material connected therewith is a part of a wall of said container.

* * * * *